United States Patent [19]
Mohsen

[11] Patent Number: 6,160,276
[45] Date of Patent: *Dec. 12, 2000

[54] DOUBLE-SIDED PROGRAMMABLE INTERCONNECT STRUCTURE

[75] Inventor: Amr M. Mohsen, Saratoga, Calif.

[73] Assignee: Aptix Corporation, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/344,220

[22] Filed: Jun. 25, 1999

Related U.S. Application Data

[62] Division of application No. 08/895,718, Jul. 17, 1997, Pat. No. 5,973,340, which is a division of application No. 08/594,929, Jan. 31, 1996, Pat. No. 5,654,564, which is a division of application No. 08/300,289, Sep. 2, 1994, Pat. No. 5,504,354, which is a continuation of application No. 07/972,884, Nov. 4, 1992, Pat. No. 5,371,390, which is a continuation of application No. 07/598,417, Oct. 15, 1990, abandoned.

[51] Int. Cl.[7] .................................................. H01L 27/10
[52] U.S. Cl. ........................... 257/209; 257/211; 257/530
[58] Field of Search .................................... 257/209, 208, 257/207, 529, 530, 211, 758, 50, 48

[56] References Cited

U.S. PATENT DOCUMENTS

| | | |
|---|---|---|
| 3,239,719 | 3/1966 | Shower . |
| 4,124,899 | 11/1978 | Birkner et al. ............................ 364/176 |
| 4,327,355 | 4/1982 | Genter et al. ......................... 340/825.9 |
| 4,354,228 | 10/1982 | Moore et al. ............................ 364/200 |

(List continued on next page.)

FOREIGN PATENT DOCUMENTS

| | | |
|---|---|---|
| 177261 A2 | 9/1986 | European Pat. Off. . |
| 204034 A2 | 10/1986 | European Pat. Off. . |
| 0 310357 | 9/1988 | European Pat. Off. . |
| 0 329018 | 2/1989 | European Pat. Off. . |
| 0 335 281 | 10/1989 | European Pat. Off. . |
| 0489571 A2 | 10/1992 | European Pat. Off. . |
| 59-161839 | 9/1984 | Japan . |
| WO 85/03804 | 2/1985 | WIPO . |
| WO 90/04233 | 10/1989 | WIPO . |

OTHER PUBLICATIONS

Barber et al., "A 64×17 Non–Blocking Cross Point Switch," 1988 IEEE Int'l Solid–State Circuits Conf., Feb. 18, 1988, pp. 116, 117 and 142.
Bogdan, "An Electrically Programmable Silicon Circuit Board," 1987, pp. 472–476.
Colbry et al., "High Performance Crospoint Switch Implemented in CMOS on AVP," *Procs. IEEE Int'l. Solid–State Circ. Conf.*, Oct. 5–8, 1987, pp. 113–116.
Donnell, "Crosspoint Switch: A PLD Approach," *Digital Design*, Jul. 1986, pp. 40–42, 44.
Hantusch, "The PIM: A Programmable Interconnection Module," Nov. 1984, 4 pages.
Hyden et al., "Silicon Circuit Boards: Off–the Shelf Convenience," *Elec. Pack. & Prod.*, Apr. 1988, pp. 70–74.
Swager, "Crosspoint–switch ICs Enter Digital Domain," *EDN*, Feb. 16, 1989, pp.76–86.
Wooley et al., "Active Substrate System Intergration," *IEEE*, 1987, pp. 468–471.
"Logically Controlled Chip Inteconnection Techniques", *IBM Technical Disclosure Bull.*, Aug. 1989, pp. 294–299.

*Primary Examiner*—Olik Chaudhuri
*Assistant Examiner*—Phat X. Cao
*Attorney, Agent, or Firm*—Skjerven, Morrill, MacPherson LLP; Alan H. MacPherson; Ronald J. Meetin

[57] ABSTRACT

An interconnect structure is centered around a substrate having opposite first and second surfaces. Component contacts allocated to cells in the substrate, are provided over both substrate surfaces. Conductive leads extend over each surface in two different directions. The conductive leads are selectively connected to the component contacts. The interconnect structure includes a capability for programmability electrically connecting, or disconnecting, the conductive leads in a desired manner.

14 Claims, 14 Drawing Sheets

U.S. PATENT DOCUMENTS

| | | | |
|---|---|---|---|
| 4,433,331 | 2/1984 | Kollaritsch | 340/825.83 |
| 4,455,495 | 6/1984 | Masuhara et al. | 307/44 |
| 4,458,297 | 7/1984 | Stopper et al. | 361/403 |
| 4,467,400 | 8/1984 | Stopper | 361/403 |
| 4,479,088 | 10/1984 | Stopper | 324/73 |
| 4,509,008 | 4/1985 | Das Gupta et al. | 324/73 |
| 4,631,686 | 12/1986 | Ikawa et al. | 364/490 |
| 4,649,413 | 3/1987 | Kelly | 357/41 |
| 4,703,436 | 10/1987 | Varshney | 364/490 |
| 4,706,216 | 11/1987 | Carter | 365/94 |
| 4,717,988 | 1/1988 | Landis | 361/403 |
| 4,727,268 | 2/1988 | Hori | 307/465 |
| 4,758,745 | 7/1988 | Elgamal et al. | 307/465 |
| 4,786,904 | 11/1988 | Graham, III et al. | 340/825.83 |
| 4,807,183 | 2/1989 | Kung et al. | 364/900 |
| 4,813,017 | 3/1989 | Wong | 364/900 |
| 4,817,093 | 3/1989 | Jacobs et al. | 365/156 |
| 4,821,176 | 4/1989 | Ward et al. | 364/200 |
| 4,833,402 | 5/1989 | Boegh-Petersen | 324/158 |
| 4,840,924 | 6/1989 | Kinbara | 437/189 |
| 4,847,732 | 7/1989 | Stopper et al. | 361/395 |
| 4,866,432 | 9/1989 | Goetting | 340/825.84 |
| 4,870,302 | 9/1989 | Freeman | 307/465 |
| 4,873,459 | 10/1989 | El Gamal et al. | 307/465 |
| 4,884,122 | 11/1989 | Eichelberger et al. | 357/71 |
| 4,906,987 | 3/1990 | Venaleck et al. | 340/825.83 |
| 4,949,084 | 8/1990 | Schwartz et al. | 340/825.83 |
| 4,963,768 | 10/1990 | Agrawal et al. | 307/465 |
| 5,015,885 | 5/1991 | El Gamal et al. | 307/465 |
| 5,036,473 | 7/1991 | Butts et al. | 364/489 |
| 5,107,146 | 4/1992 | El-Ayat | 307/465 |
| 5,109,353 | 4/1992 | Sample et al. | 364/578 |
| 5,144,548 | 9/1992 | Salandro | 364/138 |
| 5,231,588 | 7/1993 | Agrawal et al. | 364/489 |
| 5,253,181 | 10/1993 | Marui et al. | 364/489 |
| 5,255,203 | 10/1993 | Agrawal et al. | 364/489 |
| 5,295,082 | 3/1994 | Chang et al. | 364/490 |
| 5,448,496 | 9/1995 | Butts et al. | 364/489 |
| 5,452,231 | 9/1995 | Butts et al. | 364/489 |
| 5,576,554 | 11/1996 | Hsu | 257/209 |
| 5,612,891 | 3/1997 | Butts et al. | 364/489 |
| 5,657,241 | 8/1997 | Butts et al. | 364/489 |
| 5,661,662 | 8/1997 | Butts et al. | 364/489 |

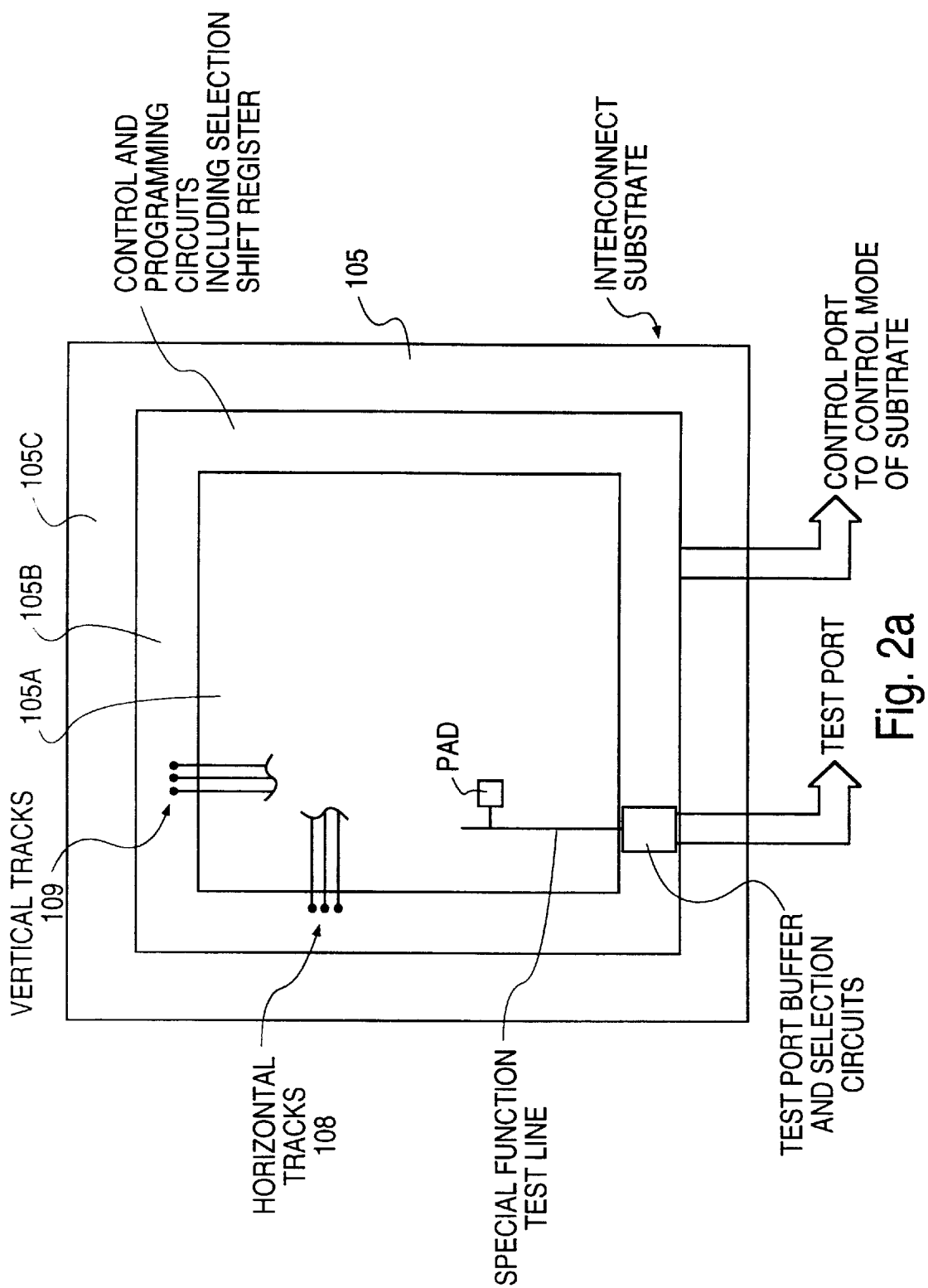

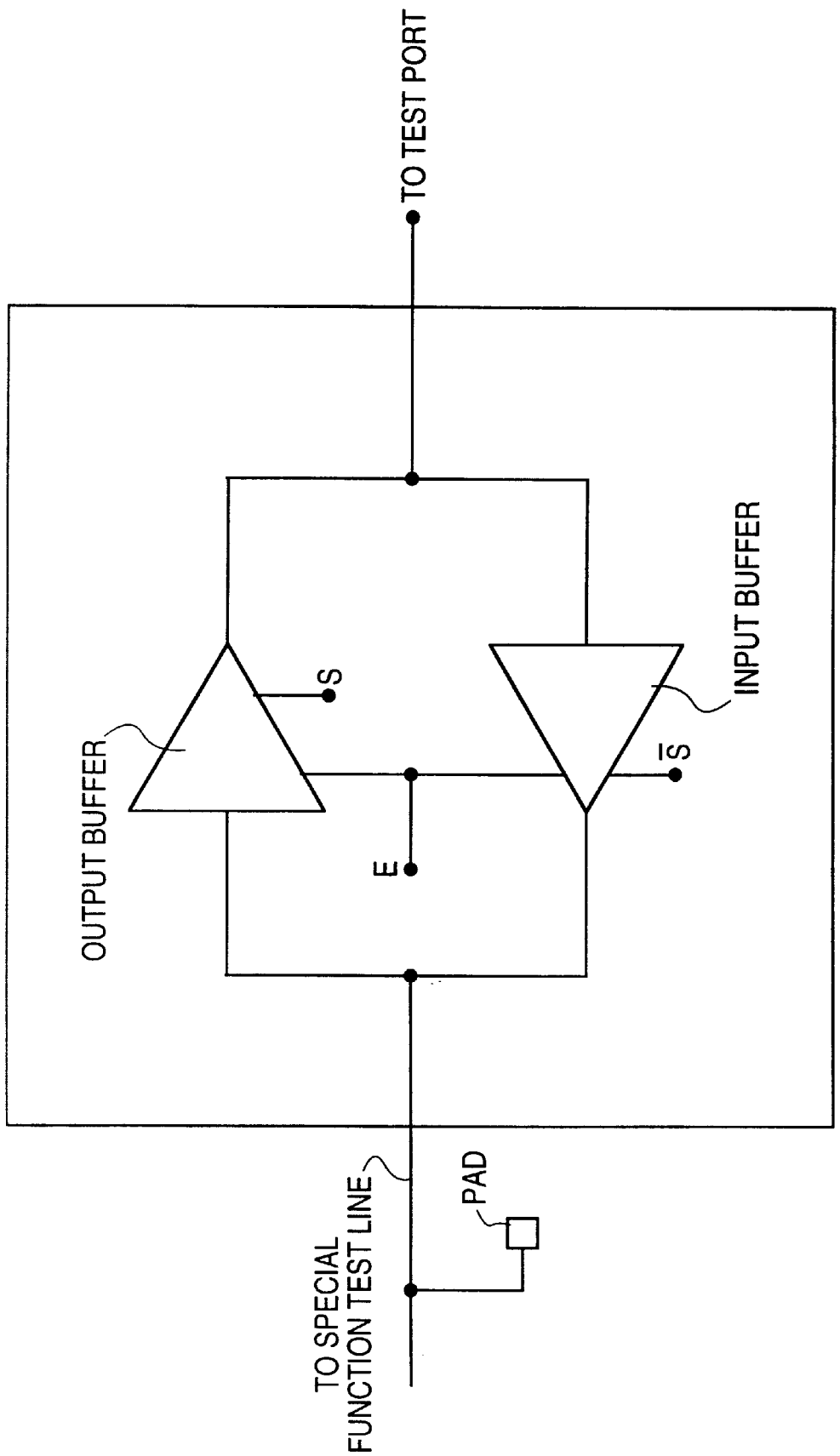

DOUBLE-SIDED PROGRAMMABLE INTERCONNECT STRUCTURE

This is a division of U.S. patent application Ser. No. 08/895,718, filed Jul. 17, 1997, now U.S. Pat. No. 5,973,340, which is a division of U.S. patent application Ser. No. 08/594,929, filed Jan. 31, 1996, now U.S. Pat. No. 5,654,564, which is a division of U.S. patent application Ser. No. 08/300,289, filed Sep. 2, 1994, now U.S. Pat. No. 5,504,354, which is a continuation of U.S. patent application Ser. No. 07/972,884, filed Nov. 4, 1992, now U.S. Pat. No. 5,371,390, which is a continuation of U.S. patent application Ser. No. 07/598,417, filed Oct. 15, 1990, now abandoned.

FIELD OF THE INVENTION

This invention relates to an interconnect substrate with circuits in or mounted on the substrate for the electrical programming in the field of the interconnects on the substrate and/or for the testing of the integrity of the interconnects, the electronic components on the substrate and the system function for hybrid circuits and multichip modules.

BACKGROUND OF THE INVENTION

Hybrid circuits and multichip modules are commonly used to connect electronic components for applications in instruments, computers, telecommunication equipment and consumer electronic products which require higher density and performance than the capabilities of printed-circuit boards. Typically, an engineer will design a hybrid circuit or a multichip module to carry the types of electronic components (including integrated circuits, transistors, and discrete components such as resistors, capacitors and inductors) necessary to implement the desired electronic function and to fit in the space available for the product. Consequently, each hybrid circuit or multichip module typically is custom designed. To design a custom hybrid circuit or a multichip module is expensive, takes time and requires custom tooling and the fabrication of prototype interconnect substrates. If errors are found in the prototypes, then the interconnect substrate must be redesigned. Such a process often delays the planned introduction of a new product. Bare dice, surface-mounted packages and electronic components are used with hybrid circuits and multichip modules, to provide high density. Shorter connection traces result in lower capacitances to drive shorter signal propagation delays, and higher performance. Testing of the integrity of the interconnects and the electronic components in the hybrid circuits and multichip modules is rather difficult. Attaching the probes of oscilloscopes and logic analyzers to observe the waveforms on the various pins of the electronic components during operation requires microprobing of fine lines and pads which is difficult. Many of the interconnects to be tested are imbedded and difficult to test. The use of test pads to access some of the imbedded traces takes area and often unintentionally overlooks important traces. The testing, diagnosis and debugging of hybrid circuits and multichip modules are complicated, time consuming and often delay the planned product introduction. In the prior art, universal interconnect substrates which can be programmed to provide any desired interconnection pattern are described in U.S. Pat. No. 4,458,297; No. 4,467,400; No. 4,487,737 and No. 4,479,088. The universal substrates in the prior art used interconnect architecture which could not be programmed or tested from external leads and which required probing of internal pads to program the connections or to test the integrity of the interconnects or the electronic components on the substrate. To optimize the number of internal pads for the programming and testing of the interconnects, prior art architecture has interconnects with excessive lengths and parasitic capacitances which reduced the speed of the connections on the substrates. The difficulties in testing and programming such universal substrates are time consuming and often increase the product development time and expenses. Other prior art (an article entitled "Active Substrate System Integration" by Wooley et al, at the Center for Integrated Systems at Stanford University, copyrighted 1987 by the IEEE) discloses the potential use of active circuits in the substrate to implement drivers, receivers, repeaters and power distribution circuits. Such circuits are custom designed for each case and are active during the operation of the electronic components and chips on the substrate to implement the desired function.

I disclose in my U.S. patent application Ser. No. 07/410,194 filed Sep. 20, 1989, entitled "Field Programmable Printed Circuit Board" a, now U.S. Pat. No. 5,377,124, printed circuit board of unique configuration combined with one or more special programmable integrated circuit chips (often called "programmable interconnect chips" or "PICs") to provide a user programmable printed circuit board capable of being used to provide any one of a plurality of functions. The active circuits in the programmable interconnect chips also provide test ports which offer powerful structures for testing the integrity of the interconnects, the electronic components and the system function.

The field programmable printed circuit board described in the above application substantially reduces the cost associated with developing complex electronic systems by providing a standard PC board configuration which is easily and economically manufactured. As disclosed in the above application, the designer of electronic systems utilizing the standard programmable PC board described therein will also utilize computer aided design software to determine the optimum placement of the electronic components on the programmable PC board and to determine the configuration of the programmable interconnect chip or chips to properly interconnect the electronic components so as to yield the desired electronic system.

In the present application, interconnect substrates for hybrid circuits and multichip modules with circuits in or mounted on the substrate are disclosed. These circuits enable the engineer by using external leads to electrically program the interconnects in the field and/or to connect any sets of nodes on the substrate to external test ports to test the integrity of the interconnects and the electronic components on the substrate and the system function. These circuits provide the benefits of the field programmable printed-circuit boards for applications requiring the density and performance of multichip modules and hybrid circuits. During normal operation these circuits in or mounted on the substrate can be disabled and the connections of the interconnects on the substrate provide the desired function.

SUMMARY OF THE INVENTION

In accordance with this invention a novel architecture of interconnects on a substrate for hybrid circuits and multichip modules is provided with circuits in or mounted on the substrate to allow the user to electrically program the interconnects in the field with external leads and without the need to use fine probes to access internal fine lines or pads on the substrate. Circuits in or mounted on the substrate enable any set of nodes on the substrate to be connected to a test port to functionally test any component on the field programmable hybrid circuit or multichip module as well as to test the internal nodes and operation of the module and the interconnect integrity of the field programmed hybrid circuit or multichip module. The field programmability and testability features and ports of the resulting hybrid circuit or multichip module are enabled either by forming circuits in the substrate which contains the multilayer interconnects, programmable elements and pads or by mounting programmable interconnect chips ("PICs") on the substrate which contains multilayer interconnects and pads. These circuits are activated, as needed, to implement the programming in the field, or the testing functions. During normal operation, these active circuits can be disabled.

In one embodiment with circuits in the substrate, the interconnect architecture comprises horizontal and vertical tracks of two or more layers of conductors. Each track has segments of varying lengths. Pads in a standard grid on the surface of the substrate are attached to some of the segments. Each segment is addressed through the circuits on the substrate. The bare dice, surface-mounted packages and electronic components are attached to the substrate and connected to the pads. Programming elements, such as antifuses, can be programmed to connect adjacent segments. By selecting the proper segments of shortest lengths, any two pads can be connected by programming the programming elements at the intersections of the proper overlying segments.

Furthermore, in accordance with this embodiment the interconnect leads formed in multiple layers on the substrate are segmented to limit the capacitance per net of interconnect. Moreover, segments of various lengths are provided to cover the various lengths of nets in the horizontal and vertical directions. Uniquely in accordance with this embodiment, the substrate on which the integrated circuits are mounted includes circuits to allow programming totally in the field by the user without the need to microprobe internal fine lines or pads. The circuits on the substrate assist with addressing and allow the steering of programming signals. In addition, circuits are provided on the substrate for testing the dice attached to the substrate for functionality and connectability as well as for testing the entire configured module. In this embodiment the substrate can be a semiconductor material such as silicon (single crystal, polycrystal or amorphous) ceramic, metal with appropriate insulation layers, glass or any other appropriate material.

An alternative embodiment of this invention uses an interconnect substrate formed of any one of a number of materials to contain a plurality of conductive traces which are routed to a portion of the interconnect substrate on which one or more programmable interconnect chips are to be mounted. The interconnect substrate can for example comprise a semiconductor material such as silicon, metal (with appropriate insulating layers formed thereon) or ceramic. The structure of the conductive traces formed on the interconnect substrate is as described in U.S. Pat. No. 5,377,124 cited above. The interconnect substrate can contain a single or multiple layers as described in U.S. Pat. No. 5,377,124. The interconnect substrate has all the advantages of the structure in the first-mentioned embodiment of this invention. The PIC mounted on the interconnect's substrate performs all the functions of the structure in the first-mentioned embodiment of this invention including programming as well as testing.

Bonding pads on the substrate are distributed in a regular pattern to make the bonding pads as general purpose as possible to be used with different dice and electronic components. Moreover, the pad layout is independent of die attach and bonding schemes (for example, wire bonding, solder bumps or TAB).

DESCRIPTION OF THE DRAWINGS

FIG. 2a illustrates an embodiment of the architecture of the programmable interconnect substrate 105 with a control port to control the function of the interconnect substrate contained thereon and a test port;

FIG. 2c illustrates a bilateral circuit for controlling the transmittal of signals to or from a test port used in conjunction with the programmable interconnect substrate 105 of this invention;

DETAILED DESCRIPTION

The following description is illustrative only and not limiting. Other embodiments of this invention will be obvious to those skilled in the art in view of this description.

FIG. 1a to 1f illustrate an embodiment of the interconnect substrate of this invention where the circuits for the programming and testing of the interconnects are in the substrate.

Figure 1A:
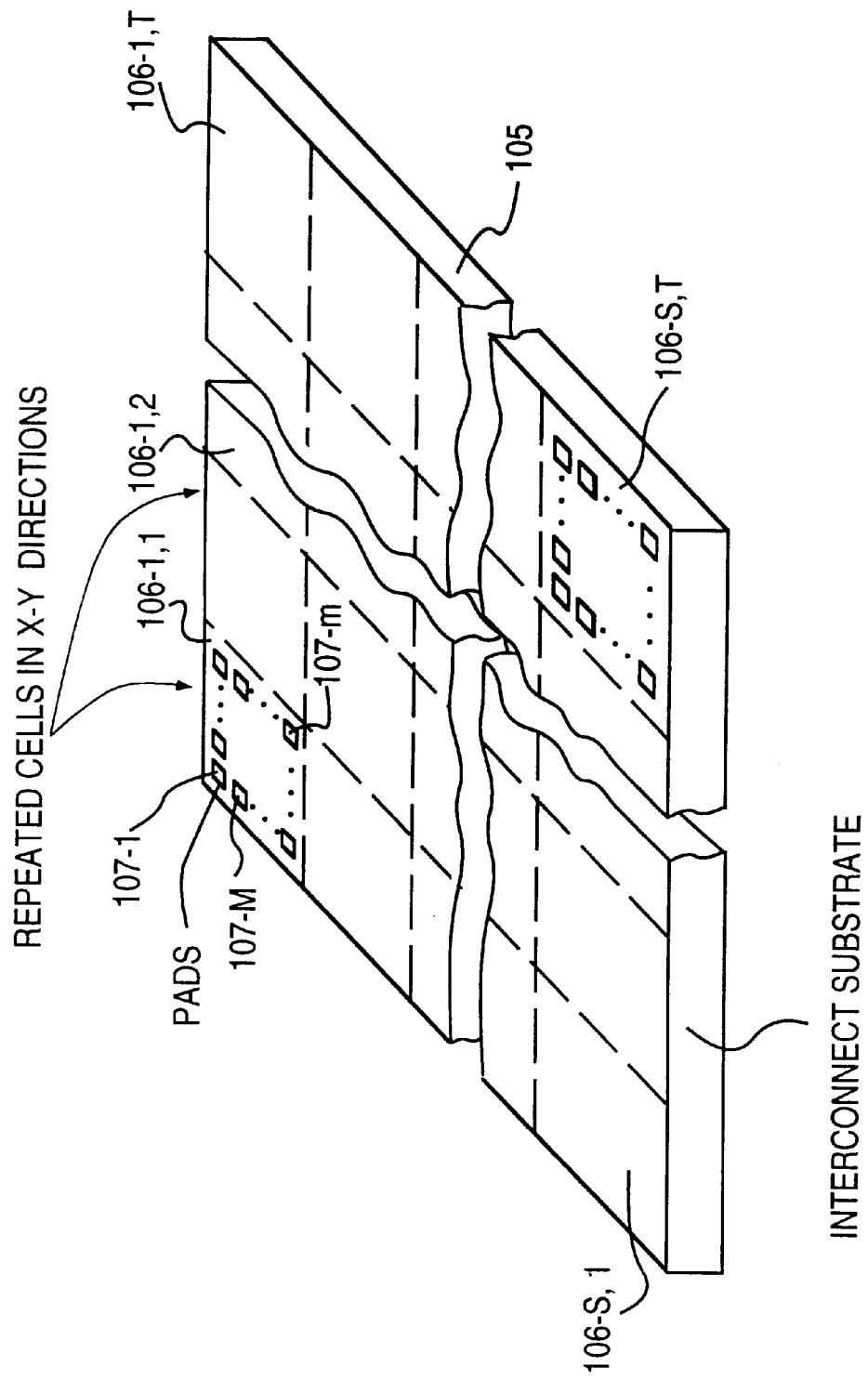
FIGS. 1a through 1g illustrate a number of interconnect structures for implementing the programmable interconnect substrate 105 suitable for use in implementing the programmable hybrid circuit and multichip module of this invention.
Figure 1B:
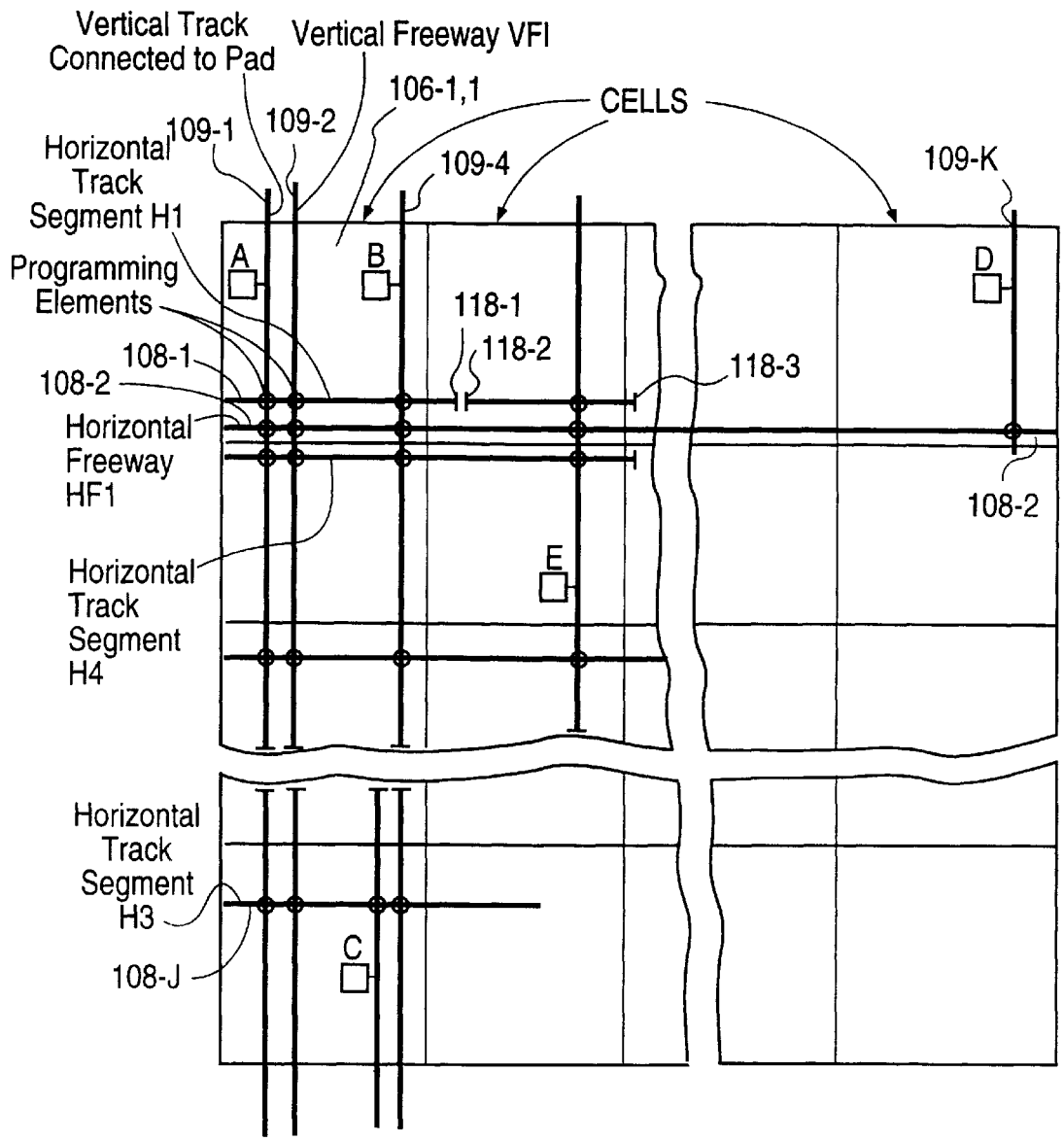

FIG. 1a and 1b illustrate programmable interconnect substrate 105 in accordance with this invention suitable for implementing the programmable interconnect substrate 105 in the structures described in the figures. In FIG. 1a the programmable interconnect substrate 105 contains a plurality of cells 106-1,1 through 106-S,T where S represents the number of rows of cells in the programmable interconnect substrate 105 and T represents the number of columns of cells in substrate 105. Each cell has formed on the portion of the top surface of the substrate above the region of the substrate in which the cell is located an array of electrically conductive pads such as the pads 107-1 through 107-M above cell 106-1,1. The geometric organization of the pads in each cell and the relative sizes of the cells are optimized to be universally used for various dice and electronic components. The optimization of the relative sizes of the cells and the organization of the pads on the semiconductor surface above each cell is determined by analyzing the sizes of the various components and chips to be interconnected using the substrate. Statistical analyses of the various sizes of these chips and components must be done to determine the distribution of both cell sizes and the configuration of the pads used in conjunction with each cell as well as the numbers of cells of each size required. An embodiment of the pad organization is a sea of pads with equal spacing in the horizontal and vertical directions. The conductive pads 107-1 through 107-M associated with cell 106-1,1 will be described in detail with the understanding that the conductive pads associated with each of the other cells 106-s,t (where s is an integer given by $1 \leq s \leq S$ and t is an integer given by $1 \leq t \leq T$) in substrate 105 can function similarly. In another embodiment of the programmable interconnect substrate, the plurality of cells 106-s,t are placed on both sides of the substrate 105 to allow electronic components and chips to be placed on both sides of the substrate to increase the packing density of the substrate.

FIG. 1b illustrates an example of the configuration of cell 106-1,1 and in a general sense the configuration of each of the other cells 106-s,t. Other configurations will be implementable by those skilled in the art in view of this disclosure. In FIG. 1b horizontal conductive tracks 108-1 through 108-J (where J is an integer representing the maximum number of horizontal conductive tracks formed on programmable interconnect substrate 105) are shown. In addition, vertical conductive tracks 109-1 through 109-K are shown (where K is an integer representing the maximum number of columns of conductive tracks formed on programmable interconnect substrate 105). In this embodiment, the horizontal conductive tracks 108-1 through 108-J are formed on one level of interconnections on substrate 105 while the vertical conductive tracks 109-1 through 109-K are formed on a second level of interconnections on substrate 105. Typically, these interconnections (which may be of any appropriate conductive material such as a silicide, doped polycrystalline silicon, a metal or metal composites) are formed in a manner well known in the semiconductor processing arts and thus the method of forming these interconnections will not be discussed. The horizontal conductive leads 108-1 through 108-J have differing lengths across the chip. The cell 106-1,1 shown in the upper left hand corner of both FIG. 1a and FIG. 1b has a plurality of horizontal conductive leads 108 originating in and extending from cell 106-1,1 to one or more of each of the other cells 106-1,2 through 106-1,T in the same row. Likewise, cell 106-1,1 has a plurality of vertical conductive leads 109 extending from cell 106-1,1 to one or more of each of the other cells 106-2,1 to 106-S,1 in the same vertical column.

The horizontal and vertical traces 108 and 109 have at each of their intersections a programmable connective structure such as for example, an antifuse or a fuse. Typically, an antifuse comprises a capacitive structure with ax-dielectric capable of being broken down by the application of a selected voltage to provide a conductive path between the two plates of the capacitor. FIG. 1f illustrates a cross-section of an antifuse between interconnect traces 108 and 109. Thick dielectric layers 110 and 111 (2 to 25 microns thick), typically formed of silicon dioxide, silicon nitride, polyimide, organic material, or a combination thereof, are formed on either side of conductive interconnect 108 and are used to minimize the parasitic capacitances of interconnect traces 108 and 109. Thin dielectric 112 (0.5 micron to 2 microns) also typically formed of-silicon dioxide, silicon nitride, polyimide, organic materials or a combination thereof, and formed above dielectric 111 and interconnect 108 but below interconnect 109 is used to provide via opening 114 small relative to the opening in dielectric 111. Typically via opening 114 will have a dimension on the order of one or two microns but the actual opening 114 may be smaller or larger than this depending on the technology of the antifuse dielectric 113 and the product application to minimize the antifuse area and the associated capacitance between interconnect traces 108 and 109. Antifuse dielectric 113 is typically formed of amorphous silicon or undoped polycrystalline silicon, or single or multiple layers of dielectrics such as silicon oxides and silicon nitrides. Antifuses are well known in the art and thus antifuse dielectric 113 will not be described in detail. Other kinds of programmable elements can also be used depending upon design considerations. In one embodiment the substrate of the programmable interconnect substrate 105 has formed on it selected devices (such as diodes and/or transistors) to enable the programming of the antifuse elements at selected intersections by using external leads in accordance with design requirements.

As shown in FIG. 1b, vertical leads 109-1 through 109-K are formed on the programmable interconnect substrate 105 so as to extend at a minimum across one cell 106 and at a maximum across all cells. Thus a plurality of vertical leads 109 cross each cell with the lengths of leads 109 varying from being such as to extend across just that cell to being such as to extend across all cells in a column.

Horizontal conductive leads 108-1 through 108-J likewise extend across the programmable interconnect substrate 105. Again, the horizontal leads 108 extending across one cell vary in lengths such that they extend across only that one cell up to a length which will extend across all cells in a row. In FIG. 1b, breaklines are included to indicate that the semiconductor substrate 105 is only partially shown with interior portions of the substrate having been removed for clarity. However, some conductive leads 108 and 109 break not because of the breaklines showing removal of semiconductor material but rather because the conductive leads are intended to stop at a given point. Small lines 118-1, 118-2 and 118-3, for example, are drawn at the terminal points of conductive lead 108-1 perpendicular to that lead to indicate that the conductive lead 108-1 is intended to terminate at those points. A horizontal conductive lead 108-j, where j is an integer given by $1 \leq j \leq J$, thus might comprise one conductive segment each extending across the whole substrate 105 or a plurality of conductive segments extending across a section of the substrate 105. Similarly, the vertical conductive leads 109-k, where k is an integer given by $1 \leq k \leq K$, likewise vary from one conductive lead which will extend across the entire height of the substrate 105 or across two or more conductive segments each extending across a selected portion of the chip.

The particular configuration of the conductive leads 108, 109 extending across one cell and from that cell to adjacent cells depends upon an analysis of the electrical functions to be carried out by the programmable hybrid circuit or multichip module. This configuration is selected using the most probable types of system requirements to be imposed on the programmable interconnect substrate 105. This selection depends upon an analysis of the circuit functions to be performed by the programmable hybrid circuit or multichip module of this invention and thus the actual configuration of the programmable interconnect substrate is determined in light of the proposed uses for the programmable hybrid circuit or multichip module. Universal configuration of these conductive leads can be defined to be useful for the majority of circuit functions and practical applications that the substrate is to be used for. The universal configuration of these conductive leads is determined by analyzing the circuit requirements by which the interconnect substrate 105 of this invention is to be put in determining the length and number of conductive leads required in both the horizontal and vertical directions. Furthermore the segmentation of the conductive leads and the number of segments of conductive leads of selected lengths used in conjunction with each row and each column of cells is also determined by such a statistical analysis. The criteria used for determining the universal configuration of these conductive leads includes the requirement that a sufficient number of conductive leads of appropriate lengths be available to allow a significant percentage of the circuits desired to be fabricated to be implemented using this technology (typically at least 95% of such circuits would have to be implementable for the number of leads to be satisfactory) and to minimize the amount of semiconductor area incorporated in substrate 105.

As shown in FIG. 1b, vertical track (i.e. conductive lead) 109-1 is electrically connected to pad A by a conductive lead 112-1 formed typically of the same conductive material as used to form track 109-1. Pad A can be formed from the same conductive material as used to form vertically track 109-1 and conductive lead 112-1. Should Pad A however be placed on a different level than conductive track 109-1, then Pad A is connected to conductive track 109-1 by trace 112-1 which extends beneath pad A to a via opened through the layers of insulating material separating conductive trace 112-1 from the conductive material making up pad A. The via is then filled with additional conductive material of the same type that is used to form pad A. This is done in a manner well known in the art and thus will not be described here. Pads Bx. C, D and E are similarly connected to the corresponding vertical conductive trace most closely adjacent to them in the same manner as described in conjunction with the connection of pad A to vertical conductive trace 109-1.

To interconnect a given lead corresponding, for example, to the lead 109-1 connected to pad A in cell 106-1,1 (FIG. 1b) to a given lead 108-j corresponding to a different pad either in cell 106-1,1 or in some different cell 106-s,t using the structure shown in FIG. 1b, an interconnection between the appropriate vertical conductor 109 and the appropriate horizontal conductor 108 is formed. For example, to connect pad A to pad B (both in cell 106-1,1) the intersection of vertical lead 109-1 and horizontal lead 108-1 is programmed by applying a high voltage to this intersection in the circuit so as to program (break down) the dielectric 113 between these two leads at this intersection and thereby form a conductive path therebetween. In addition, the intersection of vertical conductor 109-4 and horizontal conductor 108-1 is also subjected to a high voltage to program the dielectric 113 between these two leads at this point to form an additional conductive path between these two leads. Thus, pad A is connected to pad B by conductors 109-1, 108-1 and 109-4. Should it be desired to connect pad A to any other lead or pad then pad B will also be connected to that other lead or pad. However, such a connection must be compatible with the circuit in order to be made.

FIG. 1b also illustrates the particular connections which must be formed to connect pad A to pad D, pad A to pad C, or pad A to pad E. Should all of these connections be made then pads B, D, C and E will also be connected to each other through pad A. The examples of the connections described here can be used to connect signals between the electronic components and chips mounted in the substrate and to connect these components and chips to the power and ground rails and planes.

Figure 1C:
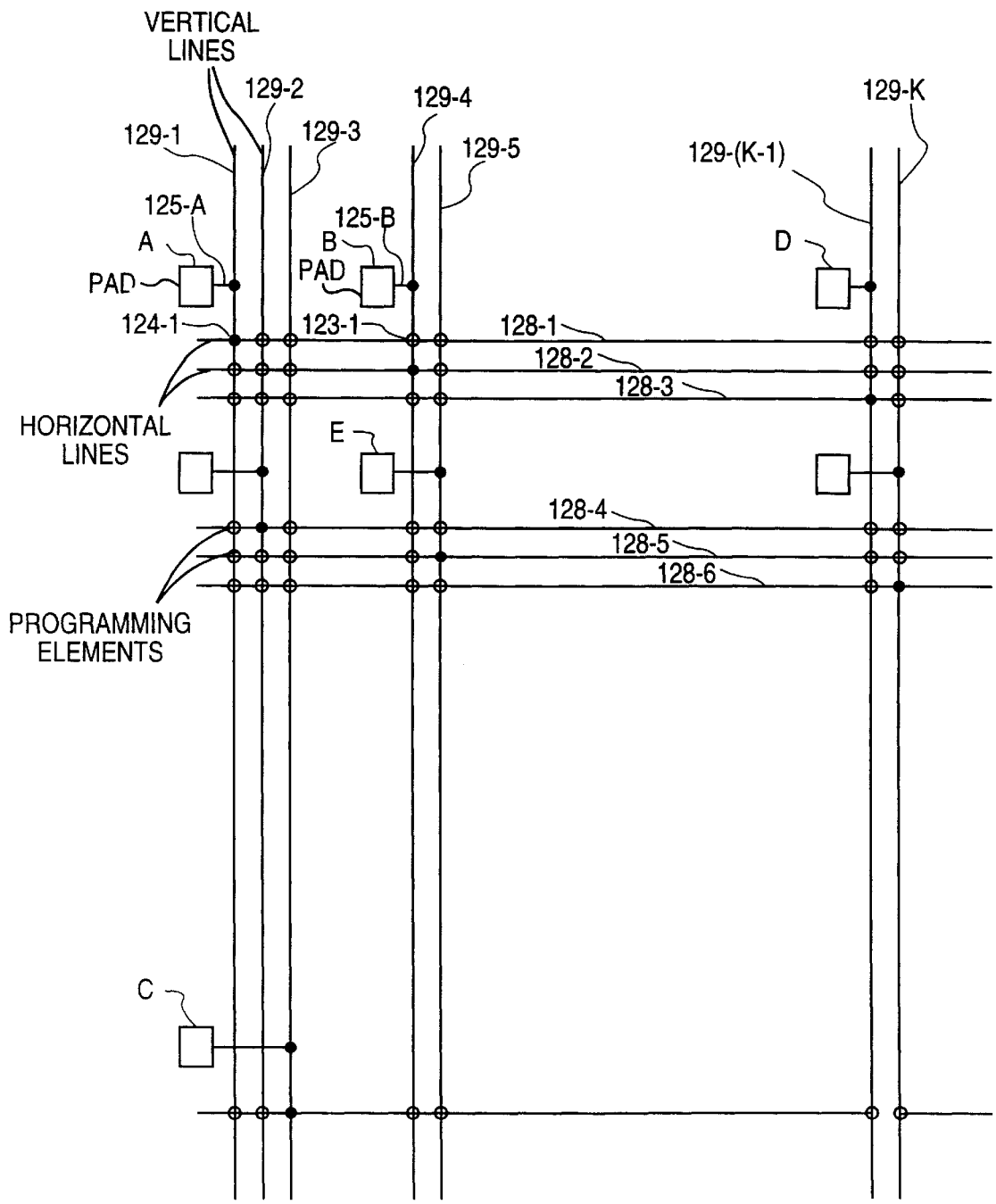

FIG. 1c illustrates a programmable interconnect substrate 105 utilizing a single cross-point switch matrix array. When the number of pads to be interconnected is quite small (e.g., on the order of 100 to 300) then the structure of FIG. 1c has certain advantages of simplicity and ease of fabrication. The structure shown in FIG. 1c is simpler than that shown in FIG. 1b in that each pad (such as pad A) is connected by a conductive trace (such as conductive lead 125-A) permanently to a vertical conductive lead (such as lead 129-1. In addition, vertical conductive lead 129-1 is permanently connected by via 124-1 (as shown by the solid dot) to horizontal conductive line 128-1. Should it be desired to connect pad A to any other pad accessible by a vertical lead 129 passing over or under horizontal lead 128-1, the circuit is programmed by applying a voltage at the correct node (such as node 123-1) to form a conductive path between the required vertical and the horizontal leads (such as horizontal lead 128-1 and vertical lead 129-4) thereby to connect pad A to pad B. Pad B is connected to vertical lead 129-4 by conductive trace 125-B. Note that each vertical line is permanently connected to one horizontal line 128 by a via (such as via 124-1). This greatly simplifies the interconnection required to program the hybrid circuit or multichip module of this invention since one pad can be connected to another by only one programming element. Also, this architecture may not need active devices in the substrate to program the desired interconnection, as the programming voltages can be applied directly to the pads. However, as the number of pads become large, this particular structure becomes relatively inefficient in its use of space on the programmable interconnect substrate 105. The total number of programming elements required equals the number of pads squared.

Figure 1D:
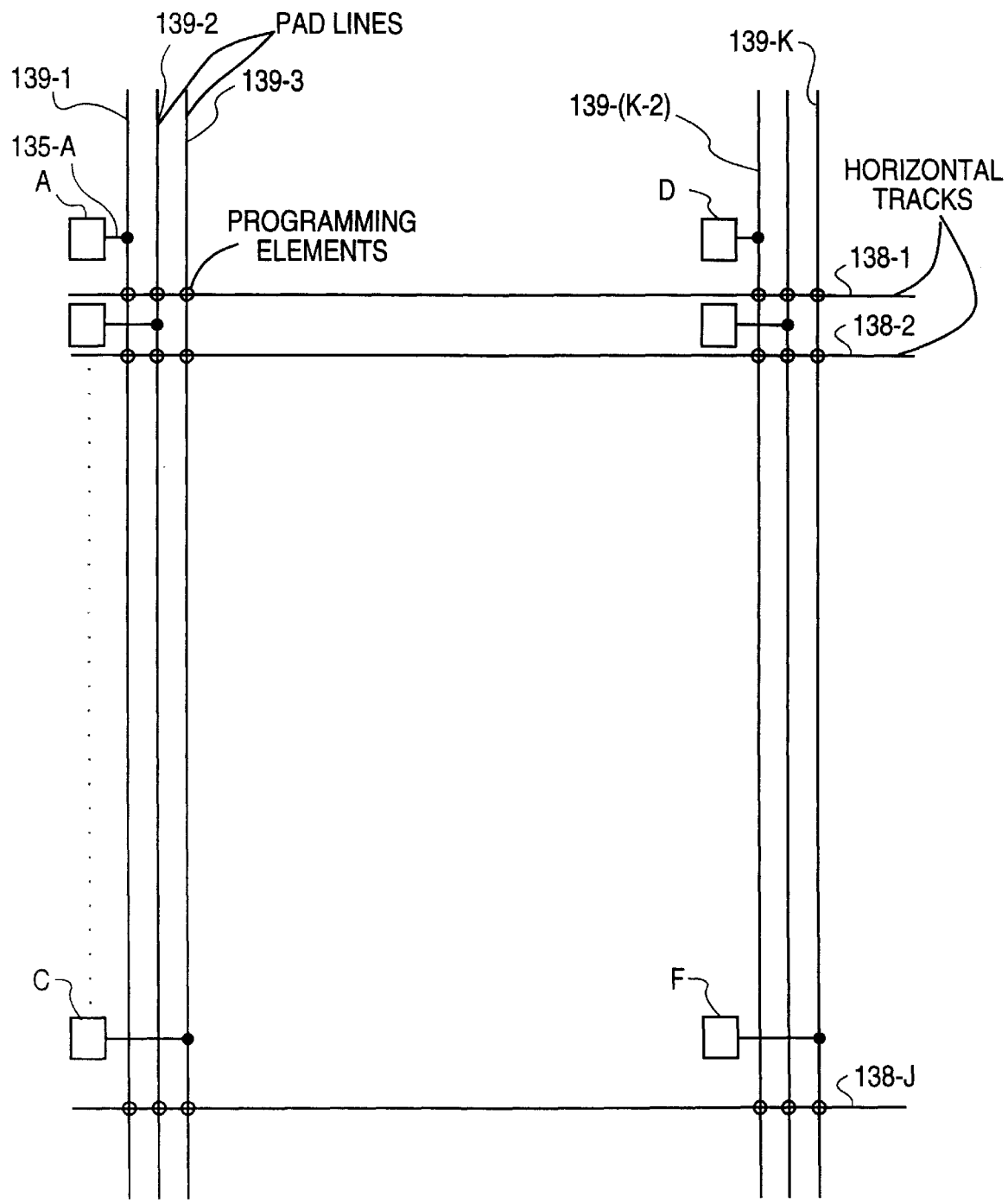

FIG. 1d shows a variation of the structure in FIG. 1c. Using the structure of FIG. 1d to interconnect pad A to pad D two programming elements must be programmed. Thus, the element at the intersection of vertical lead 139-1 and horizontal lead 138-1 must be programmed as must the element at the intersection of vertical lead 139-(K-2) and horizontal lead 138-1. However, as shown in the structure of FIG. 1d, each conductive pad such as pad A or pad D is connected by means of a conductive trace such as trace 135-A to a vertical lead 139. The number of horizontal leads in this embodiment, is less than ½ the number of vertical leads because each horizontal lead connects two pads whereas each vertical lead is connected directly to one pad only. Thus, the structure 1d has greater flexibility than that shown in FIG. 1c at the price of two programming elements per connection rather than one. The number of programming elements is ½ the square of the number of pads. In this structure, access to the horizontal tracks 138 can be made through active devices in the substrate 105. As the number of pads become larger (for example above 200 to 500 pads) this structure becomes relatively inefficient.

Figure 1E:
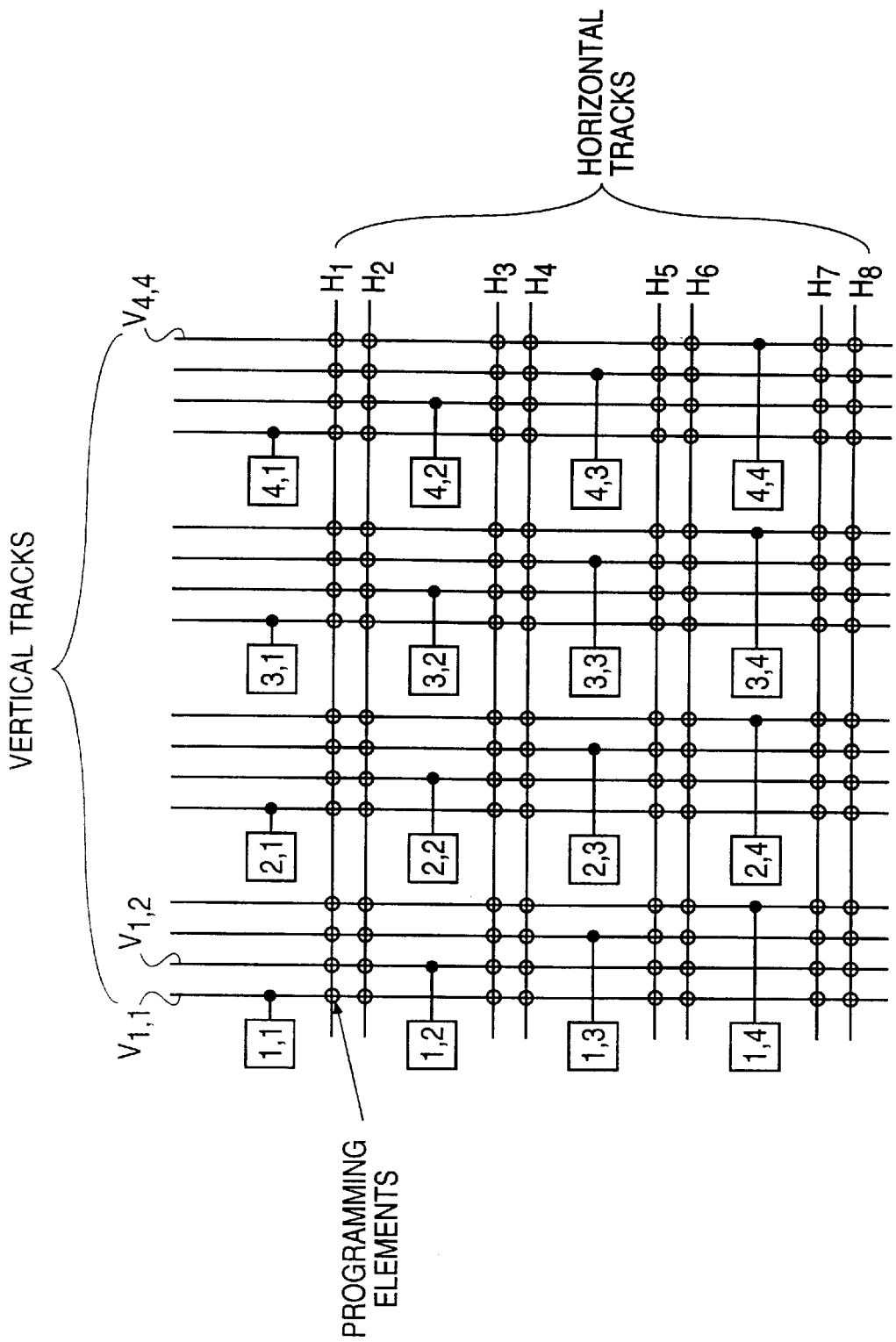
Figure 1F:
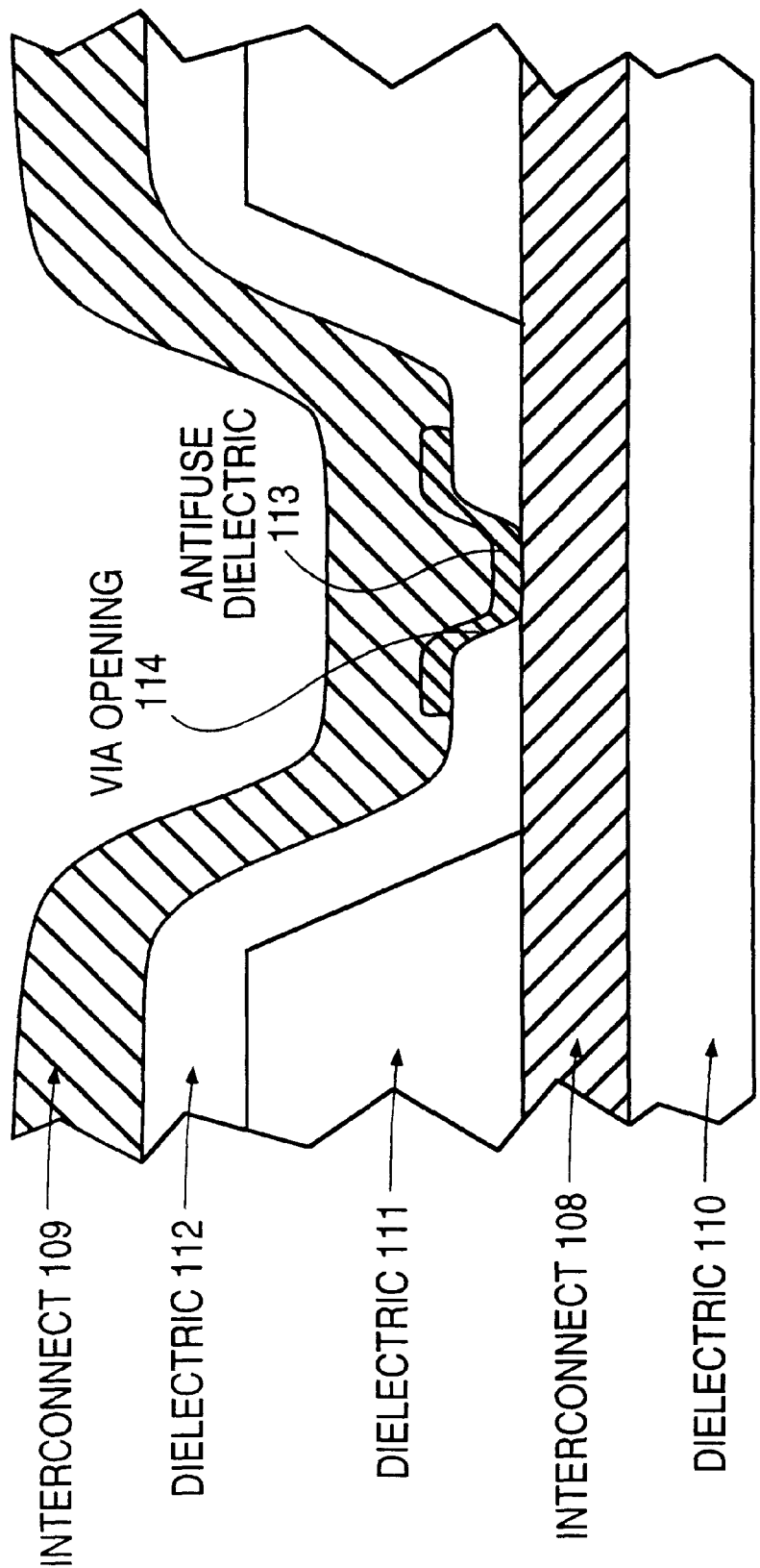

FIG. 1e illustrates the single switch cross-point matrix array of FIG. 1c with interconnections formed to connect pad 1,1 to pad 4,1. To do this, the intersection of the vertical lead $V_{1,1}$ and the horizontal lead $H_1$, is programmed as is the intersection of the vertical lead $V_{4,1}$ and the horizontal lead $H_1$. Thus, two elements have been programmed to connect pads 1,1 and 4,1. To connect pad 1,2 to pad 4,4, the programming elements at the intersection of the vertical lead $V_{1,2}$ and the horizontal lead $H_3$ and of the horizontal lead $H_3$ and the vertical lead $V_{4,4}$ are programmed. Note that as a convention in FIG. 1e, wherever the intersection of a vertical and a horizontal lead are not shown to be electrically connected by a solid dot, a programmable element (often shown by a hollow circle) will be present even though a hollow circle is not shown at such intersection.

Figure 1G:
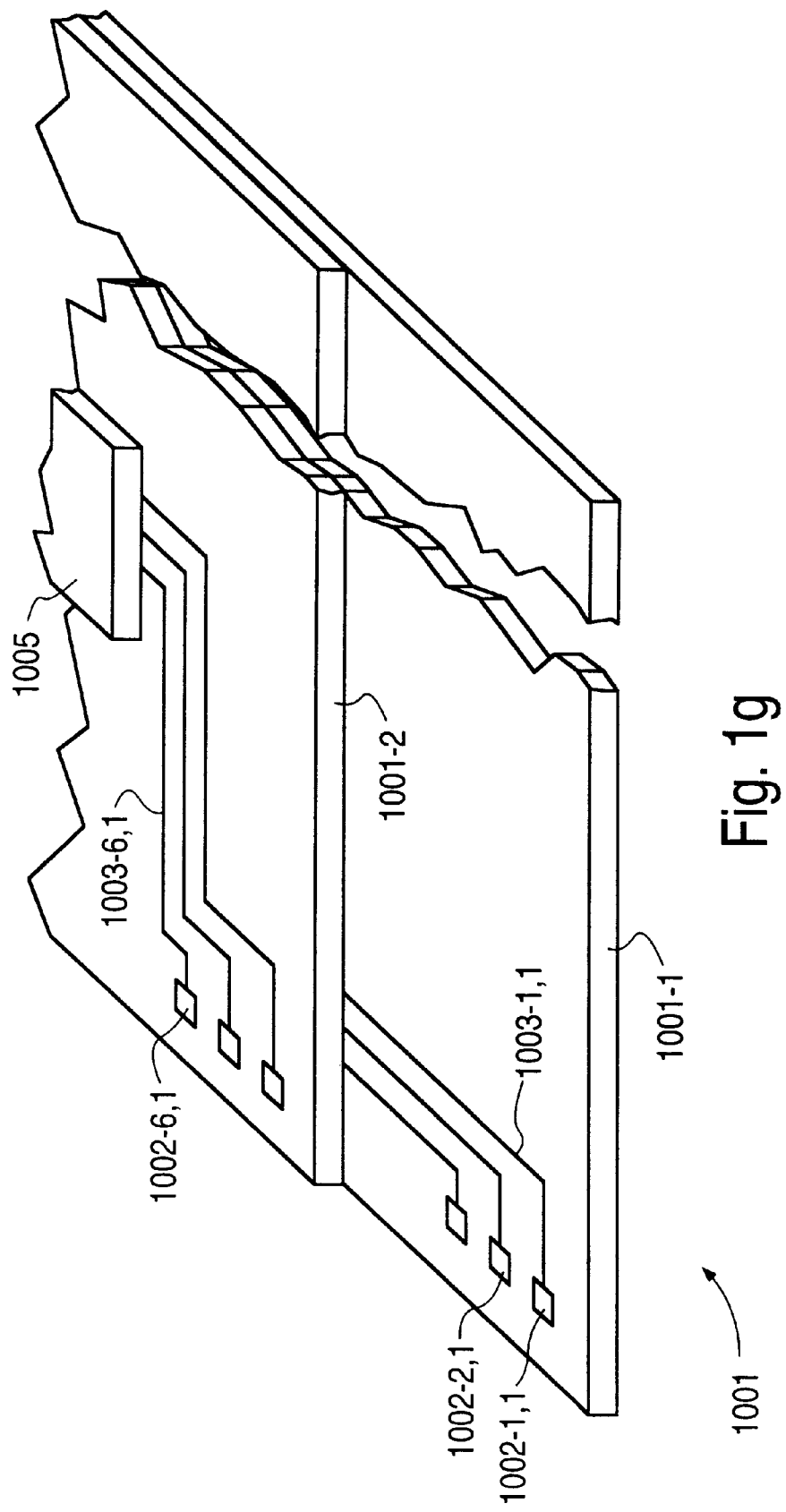

FIG. 1g illustrates an embodiment of the interconnect substrate 1001 of this invention where the active circuit for the electrical programming and the testing of the interconnects is implemented with a programmable interconnect chip ("PIC") 1005 mounted thereon. The structure of this interconnect substrate is in arrangement and function identical to that shown in FIG. 1 of U.S. Pat. No. 5,377,124 referred to above. Substrate 1001 could comprise any one of a number of materials, such as silicon, metal or ceramic, provided the materials would allow the electrical leads 1003-r,c (where r equals the number of rows of conductive pads on the interconnect substrate and c equals the number of columns of conductive pads on the interconnect substrate) to be electrically isolated from each other and thereby avoid short circuits or other unwanted electrical connections between the conductive leads 1003-r,c. Typically substrate 1001 can comprise a single layer or multiple layers of support material. Shown in FIG. 1g are two layers 1001-1 and 1001-2 of support material. Other numbers of layers can be used if desired. Each layer 1001-i is fabricated of, for example, a rigid support material such as a ceramic, a metal with appropriate insulation formed on the surface thereof, or silicon with an appropriate insulation layer formed on its surface. The leads 1003-r,c comprise any appropriate conductive material such as, for example a metal, a silicide, doped conductive silicon or other appropriate conductive material. Formed on the center of substrate 1001 or in an appropriate location on the interconnect substrate 1001 is the programmable interconnect chip 1005. Chip 1005 contains a plurality of devices (for example, programmable devices, diodes or transistors) which can be programmed by a user to interconnect selected ones of leads 1003-r,c so that the components mounted on the interconnect substrate 1001 are properly interconnected into the desired circuit. The PIC chip 1005 can contain any appropriate number of interconnect structures and in fact can be one of several such PIC chips. A more detailed description of this chip is given in the above referenced U.S. Pat. No. 5,377,124, which is hereby incorporated by reference.

FIG. 2a shows in block diagram form the architecture of an embodiment of the programmable interconnect substrate 105. Substrate 105 comprises a semiconductor material on which are formed a plurality of insulating and conductive layers. Substrate 105 is defined to include both the semiconductor material and these layers. The interior 105A of substrate 105 contains the cells 106 (as described in conjunction with FIG. 1a through 1e) and the horizontal and vertical conductive tracks 108 and 109 respectively. In peripheral area 105B, which forms an annular square around interior 105A, are placed control and programming circuits including shift registers for selecting particular horizontal and vertical tracks 108, 109 the intersections of which are to be programmed. In addition, buffer circuitry for the test port bus and the control port bus is provided in this region of substrate 105. Annular region 105C surrounds annular region 105B and contains additional circuitry essential to the operation of the substrate 105 such as mode selection circuitry which will determine whether the programmable interconnect substrate 105 is in the test mode, the operating mode or the programming mode. Additional special circuitry as required will also be placed in peripheral region 105C. The control port is capable of handling several signals, and sets the function mode of the interconnect substrate, such as programming, testing and normal operation modes. In the programming mode, information is shifted with the signals of the control port to allow the active devices in the semiconductor (typically silicon) portion of the substrate 105 to be programmed to interconnect selected conductive traces 108, 109 on the programmable interconnect substrate 105 thus forming the desired electronic system. In the testing mode, signals applied and read from the control port and the test port allow the interconnect integrity of the silicon substrate 105 and the chips and components attached to substrate 105 to be tested externally. In the test mode, the electronic components and chips on the substrate 105 can be operational real-time at the full speed or at reduced speed or frozen at a given state to allow full flexibility in testing the desired electronic system. In the normal operation mode, the active transistors in the substrate 105 are disabled and the programmed interconnects connect the attached components and chips to form the desired electronic system.

Figure 2B:
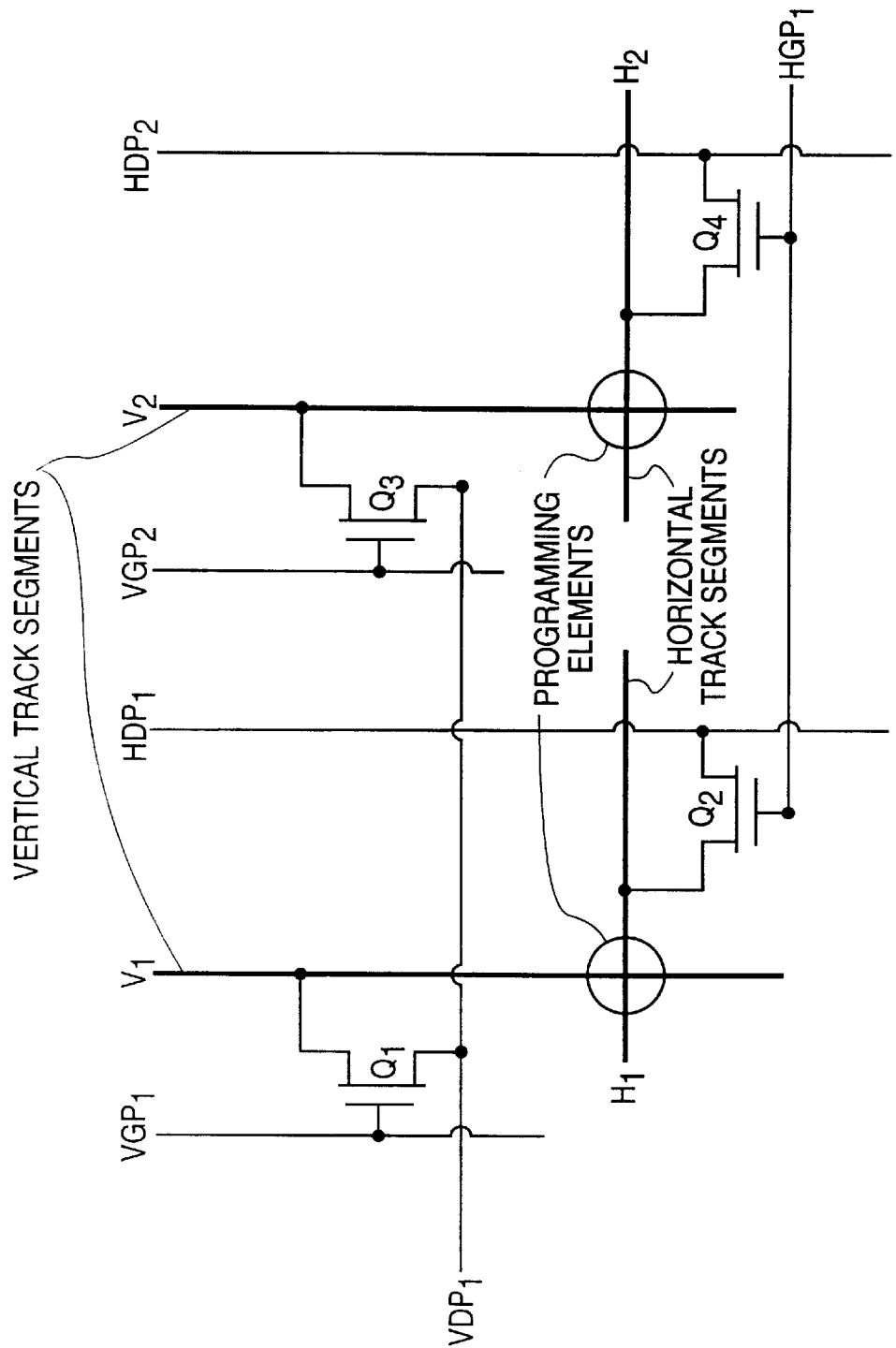
FIG. 2b illustrates one structure for programming the intersection of two conductive leads formed on the programmable interconnect substrate 105.

FIG. 2b illustrates a programming structure and particularly programming transistors and circuits within the semiconductor portion of substrate 105 to select the intersections of horizontal and vertical conductive leads 108, 109 to be programmed on the programmable interconnect substrate 105 using only two transistors in the programming circuit path. Utilization of the structure shown in FIG. 2b allows the programming current to reach the hundreds of milliamps to amperes range necessary to break down the dielectric 113 (FIG. 1f) between the vertical and horizontal conductive leads 109, 108 to form an interconnection therebetween with sufficiently low resistance. For example, with an oxide 113 thickness of 400 Å and with a gate length of 1.5 microns for the transistor Q1 and width of 2000 microns, a programming voltage of 22–24 volts can be applied to yield the 800–1500 milliamp current.

To program the intersection of vertical conductive track $V_1$ and horizontal conductive track $H_1$, transistors Q1 and Q2 are provided in substrate 105. Transistor Q1 has its gate connected to voltage source $VGP_1$ and transistor Q2 has its gate connected to a voltage source $HGP_1$. The source of transistor Q1 is connected to vertical conductive track $V_1$ while the drain of transistor Q1 is connected to conductive lead $VDP_1$. The source of transistor Q2 is connected to horizontal lead $H_1$ and the drain of transistor Q2 is connected to conductive lead $HDP_1$. To program the intersection of vertical lead $V_1$ and horizontal lead $H_1$, $VGP_1$ is applied to take the gate of Q1 to a high voltage $V_{GH}$, the gates of other transistors in the array such as transistor Q3 are held at zero volts, and the drain voltage VDP1 on transistor Q1 is taken to $V_{PP}$, the programming voltage, typically 10 to 100 volts. However, the gate voltages of Q2 and Q4 are taken high because $HGP_1$ is taken to a high voltage to turn on transistors Q2 and Q4. The voltage on the drain of Q2 is taken to zero volts by driving $HDP_1$ to zero. $HDP_2$, which applies a voltage to the drain of Q4, is taken to zero or to $V_{PP}/2$ (which voltage is selected so as not to program the programming element at the intersection of $V_2$ and $H_2$). $V_{GH}$, which is applied to lead $VGP_1$, is larger than $V_{PP}$ by the transistor threshold voltage and thus is approximately 18 to 105 volts. Because the devices Q1 to Q4 operate under high voltage, the threshold voltage of these transistors is made approximately 0.5 to 3 volts. As a result of the above-described voltages, only the programming element at the intersection of conductive lead segments $H_1$ and $V_1$ will receive the full programming voltage $V_{PP}$ and break down.

FIG. 2c shows a bidirectional amplifying circuit capable of amplifying signals coming in either direction depending upon control signals applied to the input and output buffers contained within the circuitry. Thus, as shown in FIG. 2a, each pad on programmable interconnect substrate 105 is connected to a special function test line (illustrated in FIG. 2c) and the special function test line is then capable of being connected to the test port by turning on the output buffer through a high level signal applied to the lead labeled S on the output buffer together with a high level enable signal applied on the terminal labeled E. Simultaneously with the application of a high level signal on the lead labeled S to the output buffer, a low level signal is applied to the lead labeled $\overline{S}$ to the input buffer thereby turning off the input buffer. Reverse polarity signals applied to terminals S and $\overline{S}$ result in the input buffer turning on and the output buffer turning off thereby allowing a signal from the test port to be applied to the pad. The S and E signals are transferred to the peripheral circuits in annular region 105B of FIG. 2a to select the pads on the programmable interconnect substrate to connect to the test port.

Figure 3:
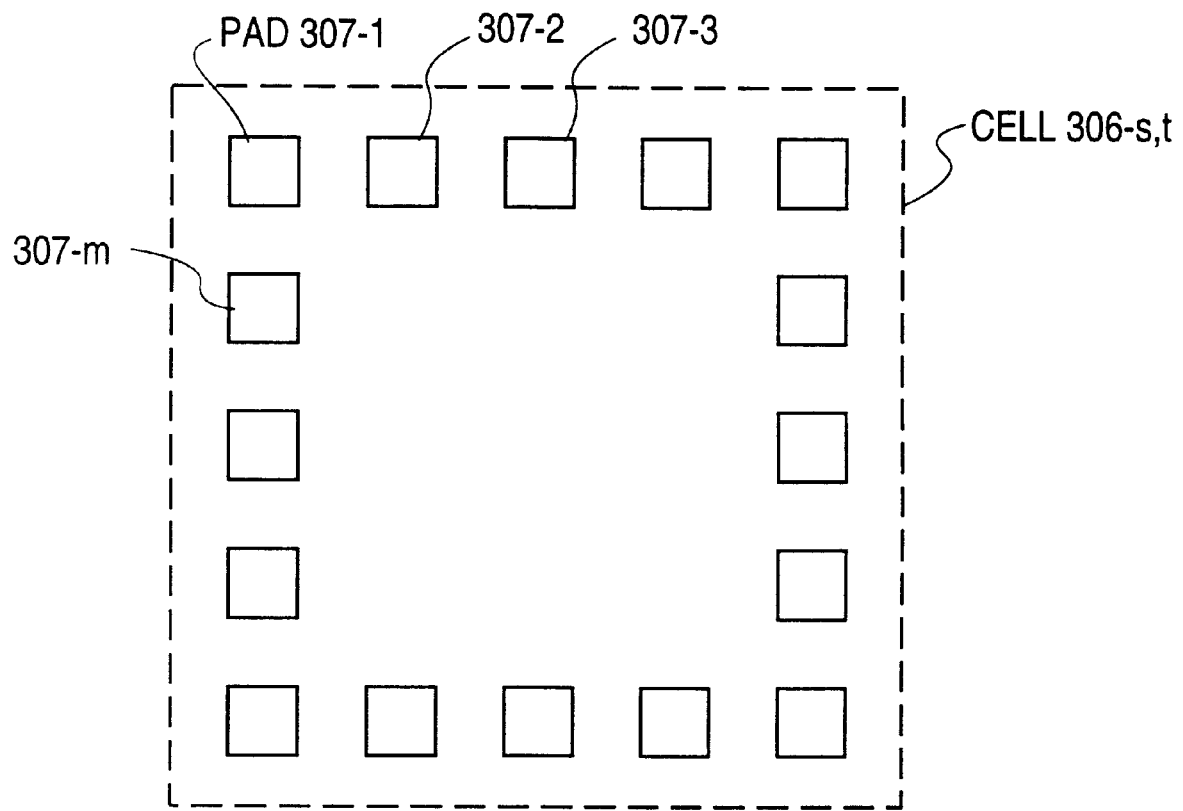
FIG. 3 illustrates a possible pad configuration as part of each cell in the substrate suitable for use in attaching chips to the programmable interconnect substrate.

FIG. 3 illustrates a cell with a plurality of bonding pads 307-1 through 307-M visible on the surface of the cell. An integrated circuit chip can be placed over one cell or over several contiguous cells depending on the size of the chip and the cells.

Figure 4A:
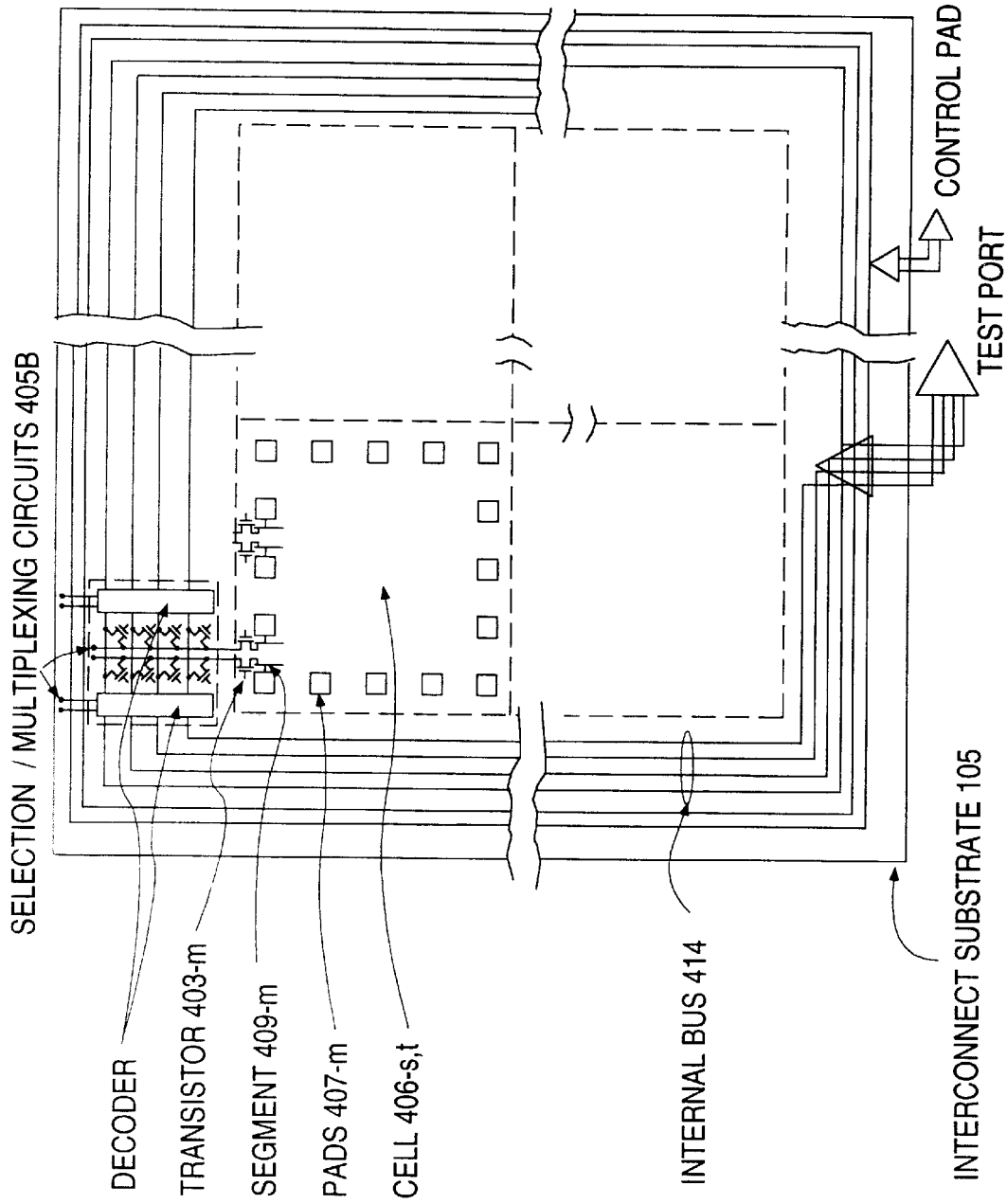
FIG. 4a and 4b illustrate the interconnect substrate with active circuits in the substrate to implement software-controlled bed-of-nails test structure for in-circuit testing and to implement an imbedded logic analyzer test structure respectively.
Figure 4B:
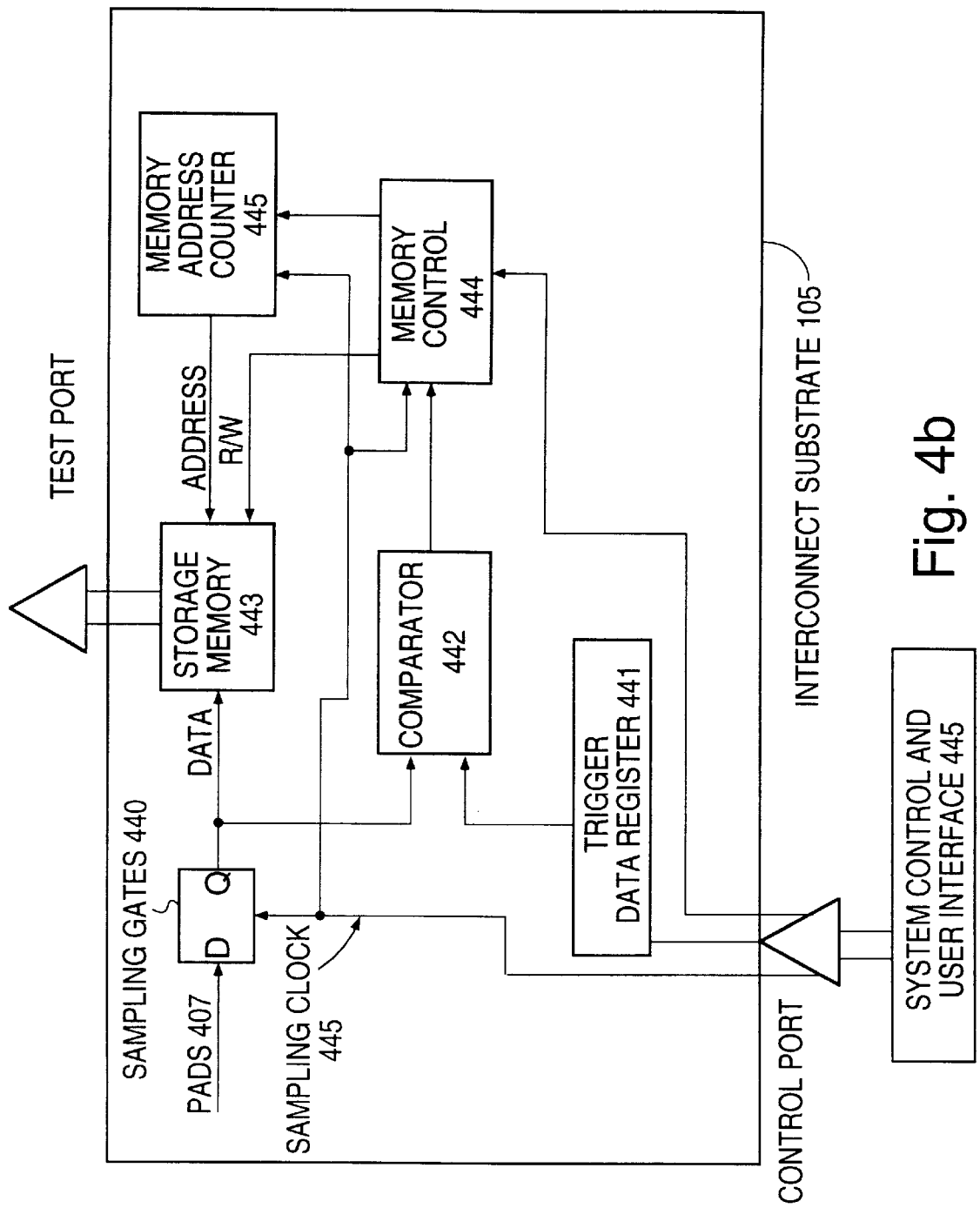

FIG. 4a and 4b illustrate the interconnect substrate such as substrate 105 of FIG. 1a or PIC 1005 of FIG. 1g with examples of circuits and structures for testing the integrity of the conductive interconnects, the electronic components and the system function.

FIG. 4a shows the block diagram and active circuits on the interconnect substrate 105 or PIC 1005 to implement a software-controlled bed-of-nails test structure. A typical cell 406-s,t on the interconnect substrate 105 with a configuration of pads 407-m is shown. Each pad 407-m is connected to a corresponding conductive segment 409-m. Active transistors 403-m and selection/multiplexing circuits 405B also formed in substrate 105 select any sets of pads 407 and connect them to an internal bus 414. In FIG. 4a, breaklines are included to indicate that the semiconductor substrate 105 is only partially shown with interior portions of substrate 105 removed for clarity. Thus, the signals applied on the control port can select any sets of pads 407 and connect them to the external leads of the test port. Hence, the user can observe the real-time waveforms or force input signals on any sets of pads connected to the test port, making it equivalent to a software-controlled bed-of-nails test structure.

FIG. 4b shows the block diagram and active circuits on the interconnect substrate 105 or PIC 1005 to implement an imbedded logic analyzer test structure. According to the signals applied to the control port of the interconnect substrate 105 or PIC 1005, key information supplied by the user is stored in the trigger data register 441. When the data sampled from the pads 407 by the sampling gates 440 in response to the sampling clock signal on lead 445 compare with the key information in the trigger data register 441, the comparator 442 initiates the memory controller 444 to start the memory address counter 445 for the storage memory 443 to store the sampled data from the pads 407 by the sampling gates 440. After suitable sampled data is stored in the memory 443, the data is shifted through the test port externally to display and analyze.

Other test structures can be implemented with active circuits in the interconnect substrate in view of this description by those skilled in the art. The active circuits for testing described are useful on interconnect substrates which can be either programmable in the field by the user as disclosed in this invention or custom designed for a desired electronic function as described in prior art for hybrid circuits and multichip modules. The circuits and block diagrams described in FIG. 4a and 4b are examples of circuits built in the substrate 105 or PIC 1005 for the testing of the integrity of the interconnects and the electronic components. Other circuits, obvious to those skilled in the art, can be built in the substrate for testing the integrity of the interconnects and electronic components or other functions of the system.

The active circuits and test structures, such as those described in FIGS. 4a and 4b, can be placed on separate diagnostic and test chips ("DTC"). The DTC chip or chips can be mounted on the substrate 1001 of FIG. 1g independently of the PIC chips to test the components attached to the substrate. By using the DTC chip without the PIC chip, feedback loops can be broken which simplify the verification and software development for the in-circuit testing of the electronic components.

Figure 5:
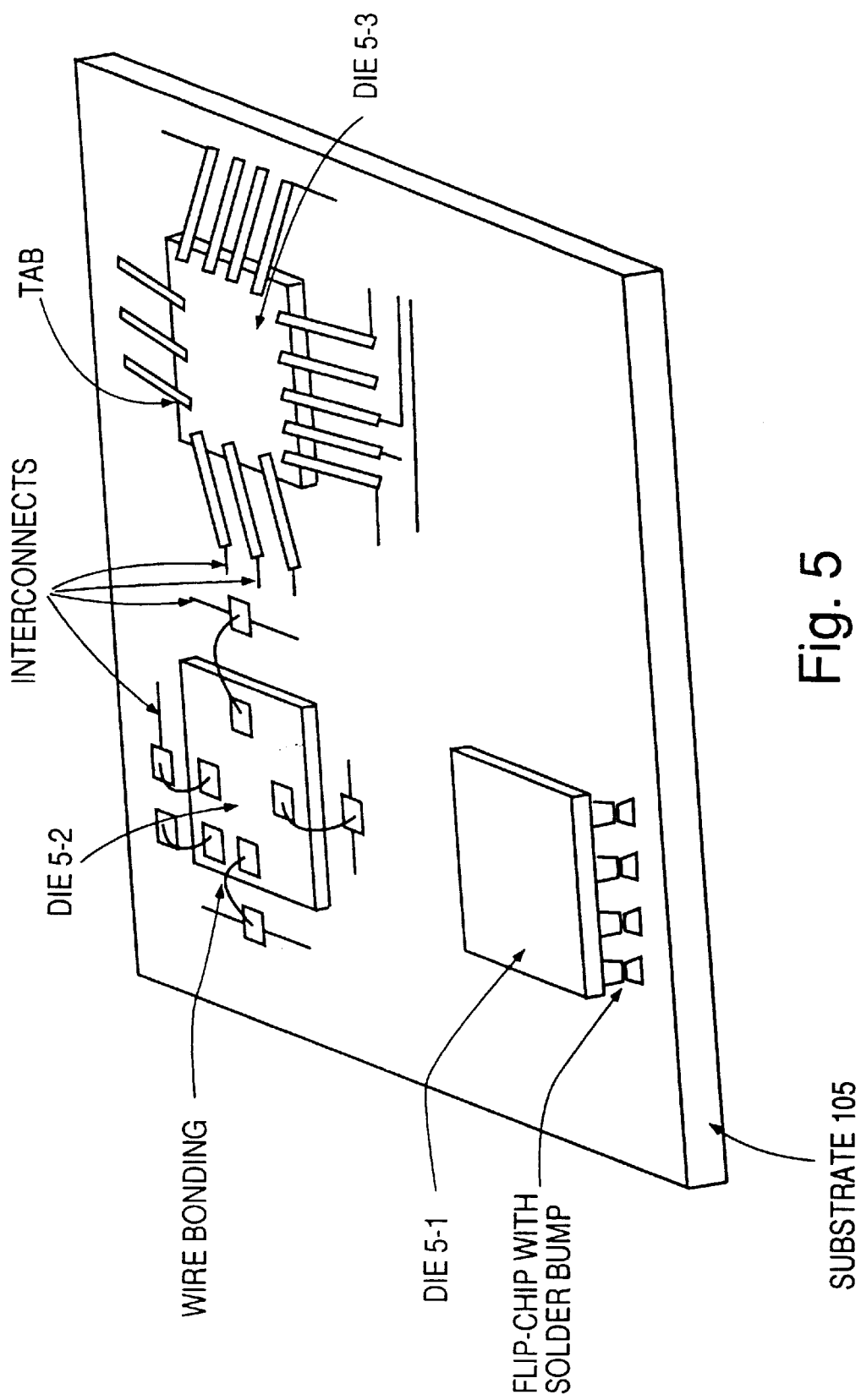
FIG. 5 illustrates in isometric view the interconnect substrate of this invention with three semiconductor chips formed on top of the substrate, one by solder bumps, one by TAB, and a third by die attach with wire bonding.

A substrate 105 with three semiconductor chips 5-1 through 5-3 mounted thereon is illustrated in FIG. 5. The chips 5-1 through 5-3 are attached to substrate 105 with conductive leads interconnecting selected ones of the orthogonal interconnects shown on the surface of substrate 105 to active devices on the semiconductor chips 5-1 through 5-3. For illustration, die 5-3 is attached and electrically connected to the substrate using TAB technology and die 5-2 is electrically connected to the substrate with wire bonds. Die 5-1 is attached and electrically connected to the substrate using solder bumps. The dice 5-1 through 5-3 and other components on the substrate 105 are interconnected with selected conductive interconnects on the substrate 105.

While conductive leads in different layers have been described as being interconnected, those skilled in the art will recognize that conductive leads in the same layer can be connected together using the antifuse techniques discussed above. To do this, a conductive trace that has been split into two or more segments such as conductive trace 108-1 in FIG. 1b can be rejoined together by applying a programming voltage between the terminals of a programming element such as an antifuse connected to the ends of segments 118-1 and 118-2 of conductive lead 108-1. This programming voltage would then cause the programming element between ends 118-1 and 118-2 to form a conductive path between these two ends of the conductive track 108-1. Alternatively, various segments of adjacent conductive leads can be interconnected by programming elements connected between sections of these adjacent segments. These programming elements can, in one embodiment, consist of sections of segments deliberately formed close together by, for example, introducing curves or bends in the leads.

As noted above, an alternative embodiment of this invention uses an interconnect substrate formed of any one of a number of materials to contain a plurality of conductive traces which are routed to a portion of the interconnect substrate on which one or more programmable interconnect chips (PICs) are to be mounted. The interconnect substrate can, for example, comprise silicon (intrinsic or appropriately covered with an insulating layer), metal (with appropriate insulating layers formed thereon) or ceramic. The structure of the conductive traces formed on the interconnect substrate is as described in U.S. Pat. No. 5,377,124, cited above. The interconnect substrate can contain a single or multiple layers of conductive traces as described in said co-pending application. The interconnect substrate has all the advantages of the structure in the first-mentioned embodiment of this invention. The PIC mounted on the interconnect's substrate performs all the functions of the structure in the first-mentioned embodiment of this invention including programming as well as testing.

The PIC, typically an integrated circuit, will consist of conductive traces and programming elements such as antifuses, for interconnecting selected traces. The PIC may also include in addition, transistors and other circuit components to assist in the programming, but these transistors and other circuit components may be excluded to simplify and reduce the cost of the PIC.

While the invention has been described in conjunction with a semiconductor substrate containing a first level of conductive leads and a second level of conductive leads, or just a single level of conductive leads, of course any number of levels of conductive leads appropriate and compatible with the processing technology can be used. While a first set of conductive leads and a second set of conductive leads have been described as being placed substantially orthogonal to each other, it should be understood that the first and second sets of leads can, if desired, be oriented in substantially different directions rather than being substantially orthogonal to each other, and the invention will still be capable of being implemented.

Other embodiments of this invention will be obvious to those skilled in the art in view of this description.

What is claimed is:

1. Structure comprising:

a substrate having a first surface and a second surface opposite the first surface, the substrate comprising (a) a plurality of first cells extending largely to the first surface, each first cell having a number of first component contacts provided over the first surface, and (b) a plurality of second cells extending largely to the second surface, each second cell having a number of component contacts provided over the second surface, the component contacts being suitable for receiving electronic components;

a plurality of first electrically conductive leads extending over the first surface in substantially a first direction;

a plurality of second electrically conductive leads extending over the first surface in substantially a second direction different from the first direction;

a plurality of third electrically conductive leads extending over the second surface in substantially a third direction;

a plurality of fourth electrically conductive leads extending over the second surface in substantially a fourth direction different from the third direction;

connection means for selectively electrically connecting the component contacts to the conductive leads; and programmable means for (a) programmably electrically connecting selected ones of the conductive leads to other ones of the conductive leads or (b) programmably electrically disconnecting selected ones of the conductive leads from other ones of the conductive leads, thereby enabling electronic components connected to the component contacts to be programmably interconnected through the component contacts, the connection means, and the conductive leads.

2. Structure as in claim 1 wherein the component contacts comprise bonding pads.

3. Structure as in claim 1 wherein the programmable means comprises multiple electrically programmable elements.

4. Structure as in claim 3 wherein the programmable elements are irreversibly programmable.

5. Structure as in claim 1 wherein:

the first cells are arranged in rows and columns; and the second cells are arranged in rows and columns.

6. Structure as in claim 1 wherein at least one of the conductive leads is divided into at least two electrically separate conductive segments.

7. Structure as in claim 6 wherein at least two of the conductive leads or segments in at least one of the pluralities of conductive leads differ in length.

8. Structure as in claim 7 wherein at least one conductive lead or segment in the plurality of first conductive leads passes in an undivided manner by at least two conductive leads or segments in the plurality of second conductive leads.

9. Structure as in claim 8 wherein at least one conductive lead or segment in the plurality of third conductive leads passes in an undivided manner by at least two conductive leads or segments in the plurality of fourth conductive leads.

10. Structure as in claim 1 wherein at least two of the conductive leads or segments in each of the pluralities of first and third conductive leads differ in length.

11. Structure as in claim 6 wherein:

the first cells are arranged in rows and columns;

at least two of the conductive leads or segments in the plurality of first conductive leads differ in length; and at least one conductive lead or segment in the plurality of first conductive leads extends across at least two of the cells in one of the rows.

12. Structure as in claim 1 wherein at least one conductive lead in each of the pluralities of conductive leads is divided into at least two electrically separate conductive segments.

13. Structure as in claim 1 wherein:

the second direction is generally perpendicular to the first direction; and the fourth direction is generally perpendicular to the third direction.

14. Structure as in claim 1 further including:

a plurality of electrically conductive traces extending over the first surface to meet selected ones of the component contacts; and at least one programmable interconnect chip connected to selected ones of the conductive traces for selectively programmably interconnecting those conductive traces.

* * * * *